United States Patent [19]
Kikuiri et al.

[11] Patent Number: 5,130,747
[45] Date of Patent: Jul. 14, 1992

[54] CARRIER APPARATUS

[75] Inventors: Nobutaka Kikuiri, Tokyo; Norio Uchida, Kanagawa, both of Japan

[73] Assignee: Kabushiki Kaisha Toshiba, Kanagawa, Japan

[21] Appl. No.: 761,507

[22] Filed: Sep. 18, 1991

[30] Foreign Application Priority Data

Sep. 28, 1990 [JP] Japan .................................. 2-259644

[51] Int. Cl.⁵ .............................................. G03B 27/60
[52] U.S. Cl. ........................................ 355/73; 355/53; 355/76
[58] Field of Search ................ 355/54, 73, 76, 91, 355/53; 269/55, 56, 58

[56] References Cited
U.S. PATENT DOCUMENTS

| | | | |
|---|---|---|---|
| 4,040,736 | 8/1977 | Johannsmeier | 355/53 X |
| 4,189,230 | 2/1980 | Zasio | 355/76 |
| 4,522,489 | 6/1985 | Bouwer | 355/53 X |
| 4,575,231 | 3/1986 | Seto | 355/76 |
| 4,669,868 | 6/1987 | Chapelle et al. | 355/53 |
| 4,788,577 | 11/1988 | Akiyama et al. | 355/53 |

OTHER PUBLICATIONS

SMC Cooperation Catalog, Free Mount Cylinder With Vacuum Pad, CAT. 88S100-10A.

Primary Examiner—Richard A. Wintercorn
Attorney, Agent, or Firm—Finnegan, Henderson, Farabow, Garrett and Dunner

[57] ABSTRACT

A carrier apparatus for carrying a plane member such as a semiconductor wafer, a mask for exposure, a optical disk substrate, a liquid crystal panel and so on. To hold such a flat member tightly, the carrier apparatus comprises an elastic member between a holding part and a carrier arm.

10 Claims, 7 Drawing Sheets 5,130,747

CARRIER APPARATUS

BACKGROUND OF THE INVENTION

1. Field of the Invention

This invention relates to a carrier apparatus for carrying a plane member such as a semiconductor wafer, a mask for manufacturing semiconductor devices, an optical disk substrate, a liquid crystal panel and so on.

2. Description of the Related Art

There are many demands for carrying a flat member precisely. One of these demands appears in the semiconductor field.

X-ray lithography systems have been developed as a lithography system to produce ultra large scale integrated circuits (ULSI). The X-ray lithography systems use X-ray from syncrotron orbital radiation (SOR) as an exposure light. By this kind of X-ray lithography, fine circuit patterns of a width is not more than 0.2 $\mu$m can be transferred to semiconductor wafers.

A conventional structure of such an X-ray lithography system is shown in FIG. 1.

Referring FIG. 1, on a wafer stage frame 11, a wafer table 13 is installed. The wafer table 13 comprises four stages. The stages have six degrees of freedum which are the X-direction, Y-direction, Z-direction, $\theta$x-rotation, $\theta$y-rotation and $\theta$z-rotation respectively. In front of the wafer table 13, a wafer chuck plate 17, which can hold and release a plane member such as a semiconductor wafer 15 by vacuum absorbing, is attached. On the other hand, a mask 19 in which described circuit patterns are attached is connected to a mask frame 23 with a mask chuck plate 21. The mask 19 is placed against the semiconductor wafer 15 holding by the mask chuck plate 21.

Then, the position of the semiconductor wafer 15 is adjusted and fixed in X-, Y-, Z-direction, $\theta$x-, $\theta$y- and $\theta$z-rotation by the four stages. The circuit patterns in the mask 19 are transferred on the semiconductor wafer 15 by exposure of X-ray emission from SOR.

Between the wafer stage frame 11 and the mask frame 23, a wafer carrier apparatus 25 is installed. The wafer carrier apparatus 25 carries the semiconductor wafer 15 and sets up the wafer 15 to the wafer chuck plate 17 or removes the wafer 15 from the wafer chuck plate 17. The wafer carrier apparatus 25 comprises a carrier arm 27 which extends vertically to the position where the semiconductor wafer 15 is fixed, a Z-direction loader 29 which moves the carrier arm in the Z-direction with a moving means such as a motor or an air cylinder device, a X-direction loader 3 which moves the carrier arm in the X-direction (perpendicular to paper) with a moving means such as a motor or an air cylinder device, and a rail 33 which guides the X-direction loader 31 when the loader 31 moves in X-direction.

FIG. 2 and FIG. 3 show how to hold the semiconductor wafer 15 to the wafer chuck plate 17.

A holding part 41, which can hold and release the semiconductor wafer 15 at the back side of the wafer, is formed on the top end of the carrier arm 27. In the holding part 41 a vacuum chucking cavity 43 is shaped. To the vacuum chucking cavity 43, a vacuum suction pipe 45 is joined. On the other hand, in the chucking face 17a of the wafer chuck plate 17, a vacuum chucking cavity 47 is shaped annularly. To the vacuum chucking cavity 47 a vacuum suction pipe 49 is joined.

The semiconductor wafer 15 is chucked and held on the holding part 41 of the carrier arm 27 and carried in the Z-direction by the Z-direction loader 31 from a starting position to the chucking point in front of the wafer chuck plate 17. After that, the semiconductor wafer 15 is carried on the Z-direction loader 29, then chucked and held on the chucking face 17a of the wafer chuck plate 17.

In the lower part on the surface of the wafer chuck plate 17, it has a notch 51 into which the holding part 41 of the carrier ar 27 is able to enter and deliver the semiconductor wafer 15 to contact with the wafer chuck plate 17 closely.

However, in the case of the conventional apparatus as described above, the carrier arm 27 is united to the holding part 41 directly in one body. Therefore, when the semiconductor wafer 15 is handed over to the wafer chuck plate 17, if the degree of parallelization between the semiconductor 15 and wafer chuck plate 17 is not enough to properly hand the wafer 15 over, as shown in FIG. 3, a space S results between them and the chucking power often can not be generated. The semiconductor wafer 15 might fall from the wafer chuck plate 17 depending on circumstances.

When the semiconductor wafer 15 is carried to a horizontal wafer chuck, the position of the semiconductor wafer 15 with respect to the wafer chuck plate 17 might vary because of insufficient holding power by wafer chuck plate 17.

The unstable position problem such as is described above occurs in the case of a mask held with a mask chuck and also in the case of flat members held to semiconductor apparatus such as a testing apparatus, eching apparatus, CVD (Chemical Vapor Deposition) apparatus and so on.

SUMMARY OF THE INVENTION

An object of the present invention is to provide a carrier apparatus which can hold a plane member tightly.

To accomplish the above-described object, a carrier apparatus comprises:

a holding means for holding and releasing a plane member, a carrier means for carrying the holding means, a connecting means for connecting the holding means and the carrier means.

an elastic member installed in the connecting means.

BRIEF DESCRIPTION OF THE DRAWINGS

Other objects and features of the invention will become apparent to those skilled in the art as the disclosure is made in the following description of a preferred embodiment of the invention, as illustrated in the accompanying sheet of drawings, in which.

DESCRIPTION OF THE PREFERRED EMBODIMENTS

Figure 1:
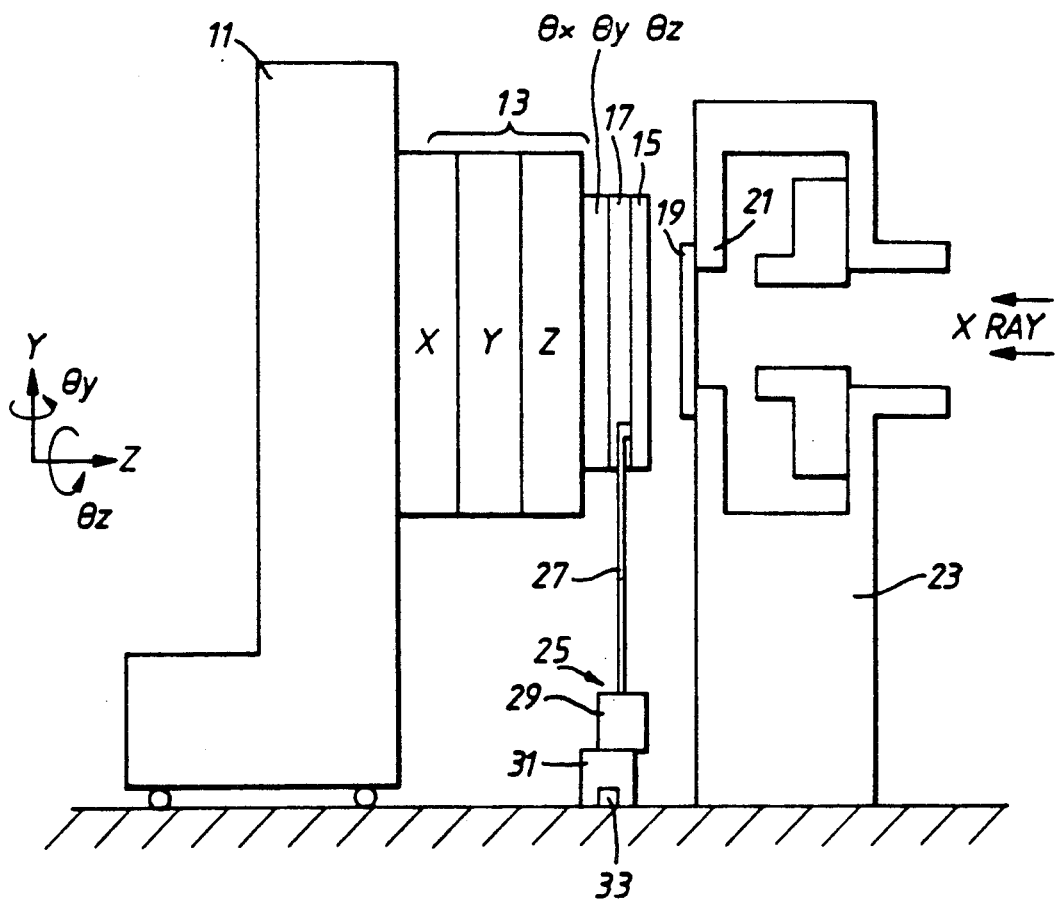
FIG. 1 is a sectional schematic view showing a structure of conventional X-ray exposure apparatus with a carrier apparatus.
Figure 2:
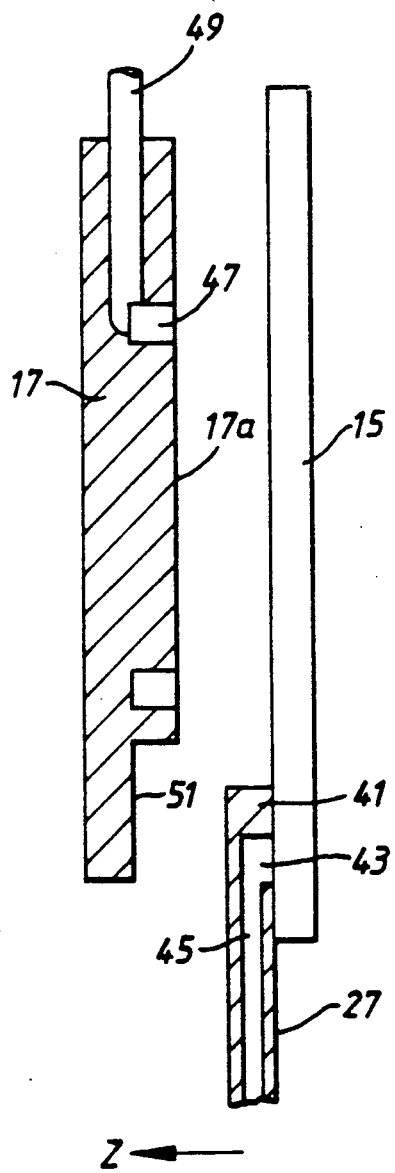
FIG. 2 and FIG. 3 are sectional views showing a structure of a chucking part of a conventional carrier apparatus in an X-ray exposure apparatus shown in FIG. 1.
Figure 3:
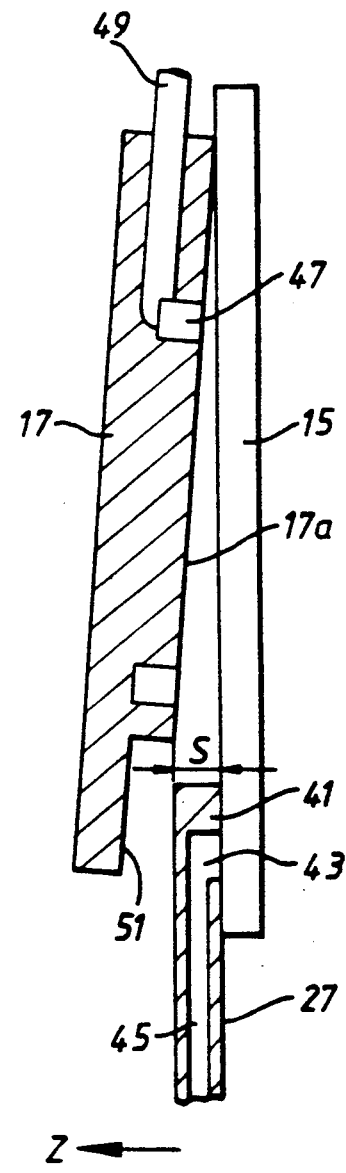
Figure 4:
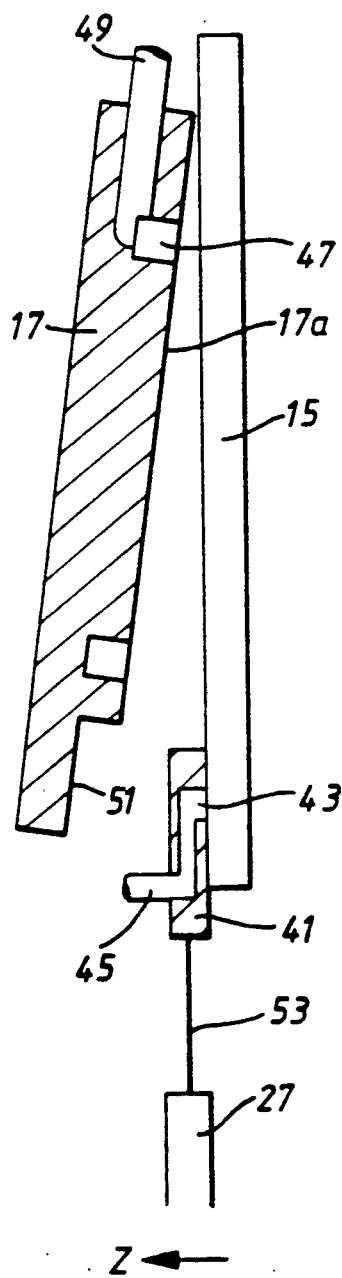
FIG. 4 and FIG. 5 are sectional views showing a structure of a chucking part of a carrier apparatus of one embodiment according to the present invention.
Figure 5:
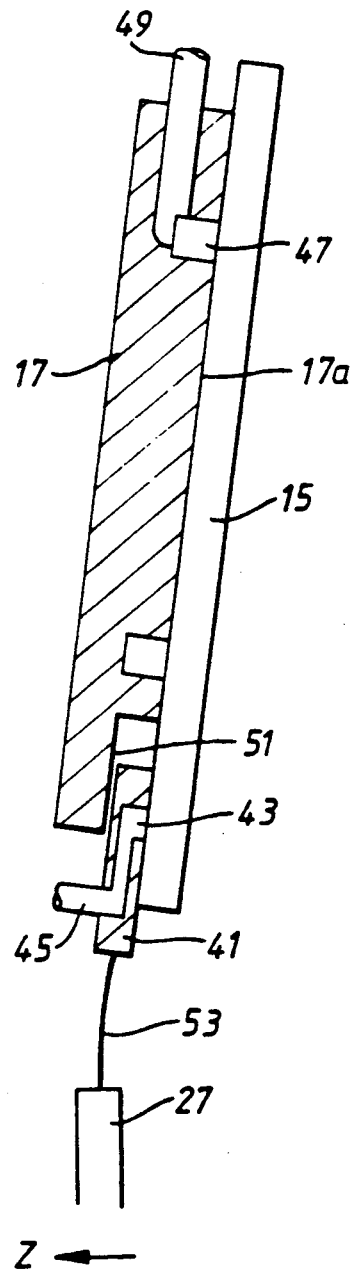

Referring to FIG. 4 and FIG. 5, the same components as those in FIG. 2 and FIG. 3 are indicated by the same reference numerals.

The carrier apparatus as shown in FIG. 4 and FIG. 5 is one of the preferred embodiment of the present invention to carry a semiconductor wafer.

A wafer chuck plate 17 has a chucking face 17a. In the chucking face 17a, there is a vacuum chucking cavity 47 shaped annularly. A vacuum suction pipe 49 is connected to the vacuum chucking cavity 47. In the lower part on the surface of the wafer chuck plate 17, it has a notch 51 such as shown in FIG. 4 and FIG. 5. A carrier arm 27 is included in a wafer carrier apparatus (as a carrier means) which carries a semiconductor wafer 15 in the Z-direction by the Z-direction loader (not shown) from a starting position to the chucking point in front of the wafer chuck plate 17. On the other hand, a holding part 41 has a vacuum chucking cavity 43 connected to the vacuum suction pipe 45 as a holding means. The holding part 41 can hold and release the semiconductor wafer 15 at the back side of the wafer. The holding part 41 is constructed separately from the carrier arm 27. The holding part 41 is joined to the carrier arm 27 with a leaf spring 53 (as a connecting means that has elasticity and will bend easily.

The material of the leaf spring 53 is selected from the group of spring steel such as Si-Mn steel, Mn-Cr steel; phosphor bronze; nickel silver (Cu-Ni-Zn alloy); beryllium copper and other elastic materials.

Figure 6:
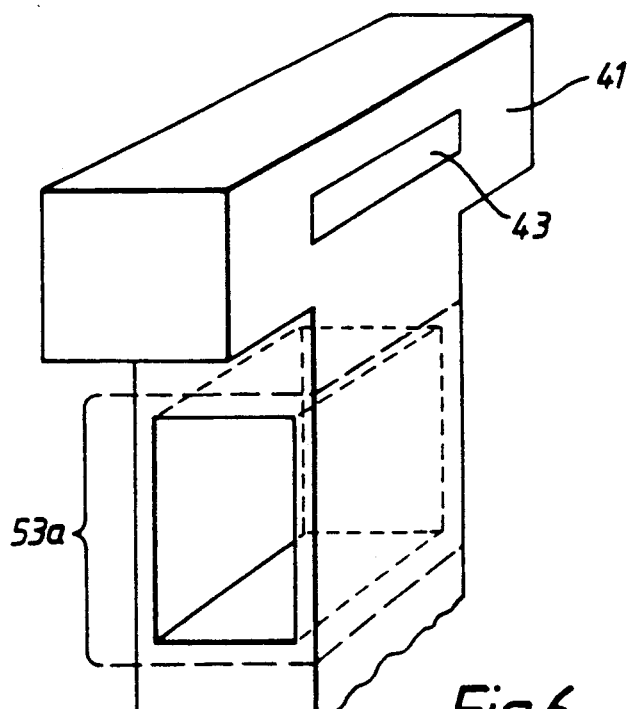
FIG. 6 and FIG. 7 are partial schematic perspective views showing a structure of a chucking part of another embodiment according to the present invention.
Figure 7:
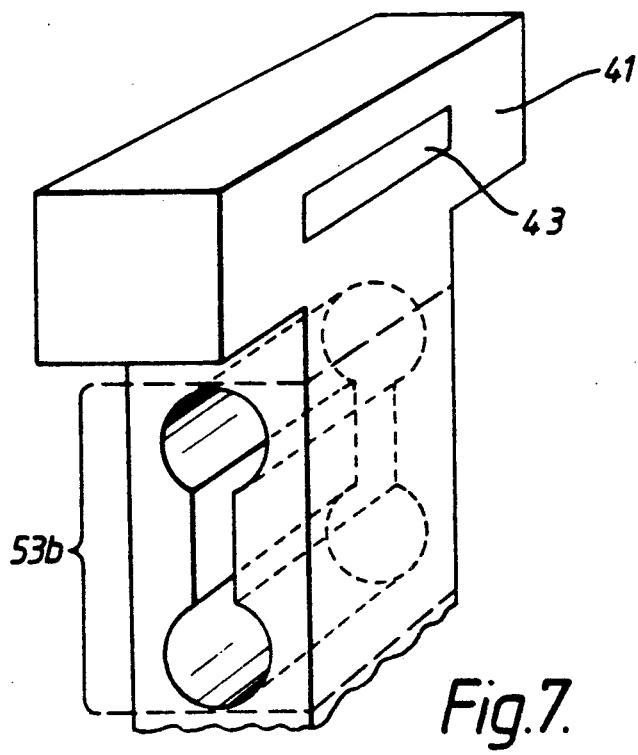

The shape of the leaf spring 53 described above is rectangular. Other shapes are also useful but the coefficient of the elasticity in Z-rection is less than in any other directions. For example, a stick which has its cross section elliptical and its line of apsides parallel to the chucking face 17a, or as shown in FIG. 6 two flat members standing opposite to each other, or as shown in FIG. 7 rectangular prism in which is bored a cavity so as to work as a hinge. In the case such as shown in FIG. 6 and FIG. 7, it might be useful that the elastic member is composed of unelastical materials.

As shown in FIG. 4, if the semiconductor wafer 15 is not parallel to the wafer chuck plate 17, then the semiconductor wafer 15 is carried toward the wafer chuck plate 17 (shown as Z-direction) with the carrier arm 27 on the Z-direction loader (not shown).

The leaf spring 53 is bent by the semiconductor wafer 15 the pushing against the wafer chuck plate 17.

Finally as shown FIG. 5, the wafer chuck plate 17 contacts the semiconductor wafer 15 in its whole surface and gets holding power to hold the semiconductor wafer 15 tightly.

Figure 8:
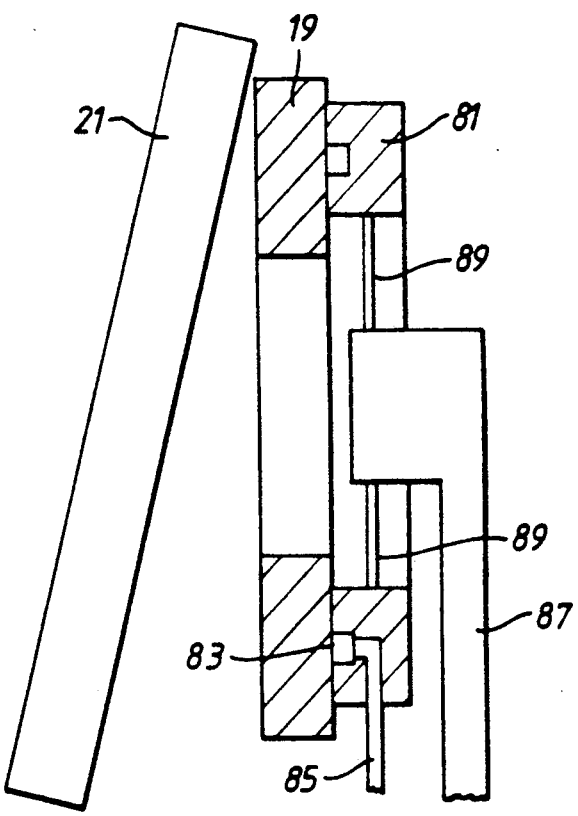
FIG. 8 is a sectional view showing a structure of a chucking part of a carrier apparatus of another embodiment according to the present invention.
Figure 9:
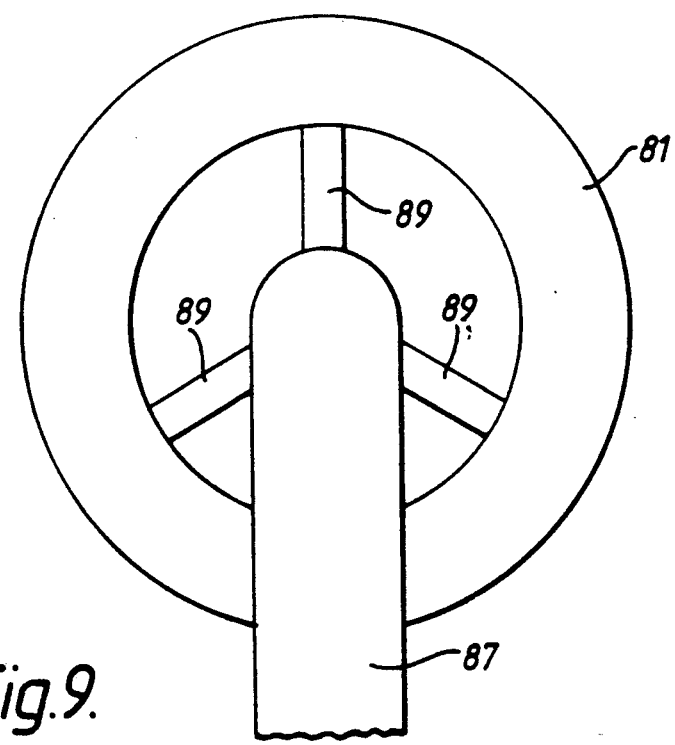
FIG. 9 is a schematic front view showing a structure of the chucking part shown in FIG. 8.

The case of carrying a mask used for exposure is shown in FIG. 8 and FIG. 9.

In FIG. 8, a holding part 81 is formed in an annular shape and on the surface of the holding part 81, a vacuum chucking cavity 83 is shaped. A vacuum suction pipe 85 is connected to the vacuum chucking cavity 83.

The holding part 81 holds a mask 19 with vacuum pressure.

A carrier arm 87 is connected to a X-direction loader and Z-direction loader (not shown), so that the carrier arm 87 is able to move the X-direction or the Z-direction individually. The top of the carrier arm 87 is almost extended to the center of the holding part 81 as shown in FIG. 8. The top of the carrier arm 87 is connected to the holding part 81 with three leaf springs 89 in a radial formation (See FIG. 9).

Therefore, as shown in FIG. 8, if a mask chuck plate 21 is not parallel with a mask 19 held by holding part 81, the mask 19 is carried to the mask chuck plate 21 (shown as Z-direction) further with the carrier arm 87 on the Z-direction loader (not shown). Then the leaf springs 89 are bent through the mask 19 by the pushing from the mask chuck plate 21.

Finally the mask chuck plate 21 contacts with the mask 19 along the whole surface closely and the mask chuck plate 21 gets the holding power to hold the mask 19 tightly.

In the case described above, if the degree of parallelization between the mask 19 and the mask chuck plate 21 is shifted in any directions and a gap is brought about, the gap may be corrected and the mask chuck plate 21 holds the mask 19 tightly.

The number of the leaf springs 89 is not limited to three. The shape of the leaf spring is not limited to rectangular and any shapes such as shown in FIG. 6 and FIG. 7 may be used.

Figure 10:
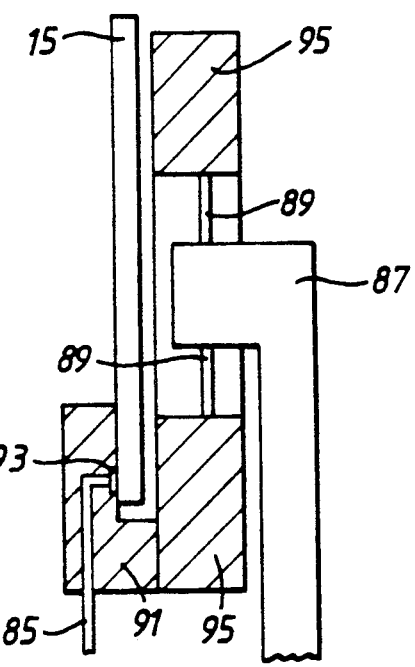
FIG. 10 is a sectional view showing a structure of a chucking part of another embodiment according to the present invention.

A holding part shown in FIG. 10 is a further modification of the holding part shown in FIG. 8 to carry a semiconductor wafer.

This holding part carries a semiconductor wafer 15 held by the holding part 91 at the back side face of the semiconductor wafer 15. A vacuum suction pipe 85 is connected to a vacuum chucking cavity 93 to hold the semiconductor wafer 15 with vacuum. The holding part 91 is fixed to a annular plate 95 such as the holding part 81 shown in FIG. 9. The annular plate 95 is connected to a carrier arm 87 with three leaf springs in the same shape as shown in FIG. 9.

The semiconductor wafer 15 held with the holding part 91 as shown in FIG. 9 is carried in the Z-direction. Then if the semiconductor wafer 15 is not in parallel position to the wafer chuck plate (not shown), the semiconductor wafer 15 is carried in the direction to the wafer chuck plate shown as Z-direction) further with the carrier arm 87. The leaf springs 89 are bent and finally the wafer chuck plate contacts the semiconductor wafer 15 along the whole surface closely. The wafer chuck holds the semiconductor wafer 15 tightly.

Figure 11:
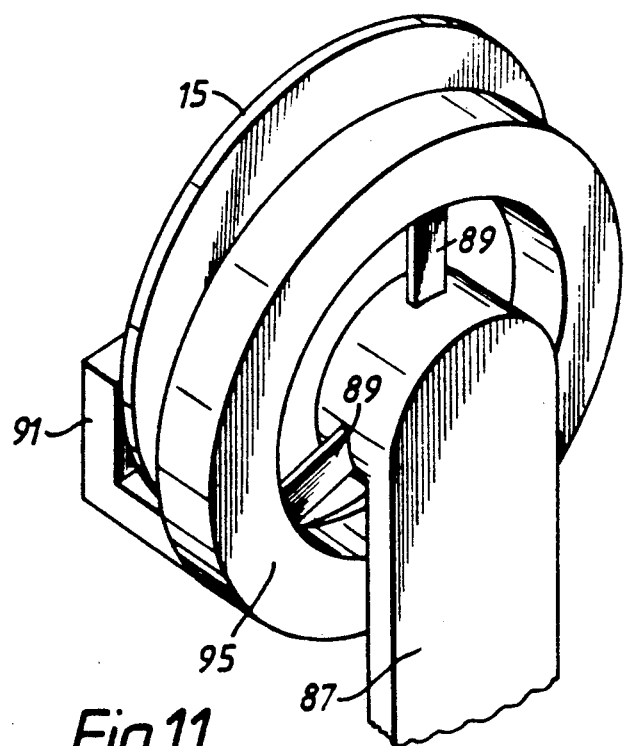
FIG. 11 is a perspective view showing a external appearance of the chucking part shown in FIG. 10; and, FIG. 12 is a sectional schematic view showing a exposure apparatus with another carrier apparatus according to the present invention.

FIG. 11 shows a perspective view of the structure shown in FIG. 10.

Figure 12:
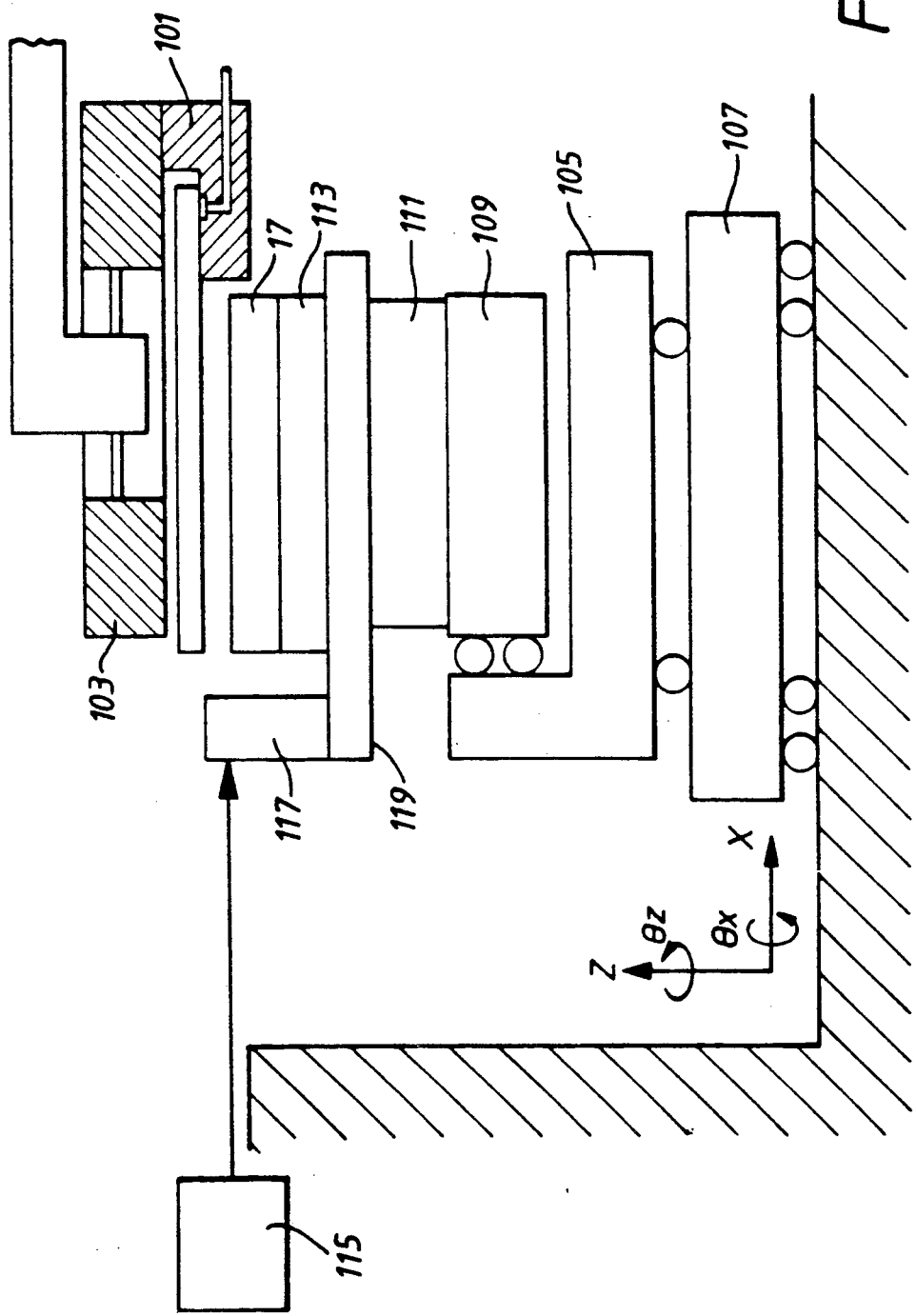

Another carrier apparatus according to the present invention is shown in FIG. 12. In this carrier apparatus the holding part 101 and annular plate 103 shown in FIG. 11 are also used in a horizontal position.

The carrier apparatus shown in FIG. 12 has six degree of freedum which are X-direction, Y-direction, Z-direction, $\theta$x-rotation, $\theta$y-rotation and $\theta$z-rotation.

So a X-direction loader 105, a Y-direction loader 107, a Z-direction loader 109, a $\theta x$, $\theta y$-direction rotator 111, a $\theta z$-direction rotator 113 are installed. On the $\theta z$-direction loader a wafer chuck plate 17 is installed. For positioning this carrier apparatus has a laser interferometer 115, a L-shaped mirror 117 and a mirror mount 119.

In any of the embodiments as described above, the way of vacuum chucking to hold a wafer or mask is used. However other chucking ways such as a electrostatic chucking way are also useful for the present invention.

What is claimed is:

1. A carrier apparatus, comprising:
   a holding means for alternately holding and releasing a plane member;
   a carrier means for carrying the holding means;
   a connecting means for connecting the holding means and the carrier means; and,
   at least one elastic member installed in the connecting means.

2. A carrier apparatus according to claim 1, wherein;
   the connecting means includes a carrier arm; and,
   the elastic member is installed between the carrier arm and the holding means.

3. A carrier apparatus according to claim 2, wherein;
   the holding means including a ring-shaped flat member.

4. A carrier apparatus according to claim 3, wherein;
   two or more elastic members are arranged in radial formation.

5. A carrier apparatus according to claim 3, wherein;
   the holding means includes a holding part connected to the ring-shaped flat member.

6. An Exposure Apparatus Comprising;
   an exposure means;
   a holding means for alternately holding and releasing a plane member;
   a carrier means for carrying the holding means;
   a connecting means for connecting the holding means and the carrier means; and,
   at least one elastic member installed in the connecting means.

7. An Exposure Apparatus according to claim 6, wherein;
   the connecting means includes a carrier arm; and,
   the elastic member is installed between the carrier arm and the holding means.

8. An Exposure Apparatus according to claim 7, wherein;
   the holding means including a ring-shaped flat member.

9. An Exposure Apparatus according to claim 8, wherein;
   two or more elastic members are arranged in radial formation.

10. An Exposure Apparatus according to claim 8, wherein;
    the holding means includes a holding part connected to the ring-shaped flat member.

* * * * *